United States Patent
Watanabe

(10) Patent No.: US 7,630,596 B2
(45) Date of Patent: Dec. 8, 2009

(54) SILICON STRUCTURE AND METHOD OF MANUFACTURING THE SAME

(76) Inventor: Shinya Watanabe, c/o NEC Corporation, 7-1, Shiba 5-chome, Minato-ku, Tokyo (JP)

( * ) Notice: Subject to any disclaimer, the term of this patent is extended or adjusted under 35 U.S.C. 154(b) by 0 days.

(21) Appl. No.: 12/163,092

(22) Filed: Jun. 27, 2008

(65) Prior Publication Data

US 2009/0003754 A1    Jan. 1, 2009

(30) Foreign Application Priority Data

Jun. 28, 2007    (JP) .............................. 2007-170292

(51) Int. Cl.
*G02B 6/10* (2006.01)
*G02F 1/035* (2006.01)

(52) U.S. Cl. ................. 385/14; 385/1; 385/3; 385/131; 216/2

(58) Field of Classification Search ............ 385/1, 385/3, 14, 129–132; 216/2
See application file for complete search history.

(56) References Cited

U.S. PATENT DOCUMENTS 5,117,470 A * 5/1992 Inoue et al. .................... 385/14
6,020,272 A    2/2000 Fleming
6,870,979 B2 * 3/2005 Kawashima et al. ........... 385/14
7,333,679 B2 * 2/2008 Takahashi ....................... 385/1
7,565,038 B2 * 7/2009 Earnshaw ....................... 385/1
2005/0169566 A1    8/2005 Takahashi

FOREIGN PATENT DOCUMENTS

| JP | 10506756 A | 6/1998 |
| JP | 2001521180 A | 11/2001 |
| JP | 200429359 A | 1/2004 |
| JP | 2004037524 A | 2/2004 |
| JP | 2004133130 A | 4/2004 |
| WO | 2006050607 A1 | 5/2006 |

OTHER PUBLICATIONS

Akio Sugita et al., Bridge-Suspended Silica-Waveguide Thermo-Optic Phase Shifter and Its Application to Mach-Zehnder Type Optical Switch, Jan. 1, 1990, pp. 105-109, vol. E 73, No. 1, the Transactions of the IEICE.
European Search Report for Application No. EP 08159202.4 completed Oct. 9, 2008.

* cited by examiner

*Primary Examiner*—Daniel Petkovsek

(57) ABSTRACT

A silicon structure includes a silicon substrate; and an on-substrate structure including a silicon compound film and formed on said silicon substrate. At least one removal section removed through anisotropic etching and at least one supporting column left through the anisotropic etching to support said on-substrate structure are provided for a direct lower portion of said silicon substrate directly beneath said on-substrate structure.

12 Claims, 12 Drawing Sheets

3: OPTICAL WAVEGUIDE (100)

100: ETCHING RATE IS HIGH

7: FUNDAMENTAL CURVE

A21-A21'

B21-B21'

SILICON STRUCTURE AND METHOD OF MANUFACTURING THE SAME

INCORPORATION BY REFERENCE

This Patent Application claims priority on convention based on Japanese Patent Application No. 2007-170292 filed on Jun. 28, 2007. The disclosure thereof is incorporated herein by reference.

TECHNICAL FIELD

The present invention relates to a silicon structure, and more particularly relates to a silicon structure formed of silicon compound on a silicon substrate.

BACKGROUND ART

As one application of a silicon structure, a planner lightwave circuit (PLC) is known. Among various optical devices for optical communication, the device using the planner lightwave circuit is superior in miniaturizing, functioning and integrating the device, because a process for manufacturing a semiconductor circuit can be used.

Usually, an optical waveguide circuit is manufactured by a PLC manufacturing technique as follows. At first, a lower clad layer is formed on a silicon substrate, and then a core film through which light is guided is formed. Here, the core film is patterned into a core of a desired layout through a photolithography and a dry etching by using photo mask. After that, a reflow layer film is formed to embed the core. Then, an upper clad layer is formed thereon. The optical waveguide circuit manufactured in this way can have various functions such as an AWG (Arrayed Waveguides Grating) for coupling/decoupling a plurality of lights of wavelengths, a VOA (Variable Optical Attenuator) for attenuating an input light by a desirable quantity, and an optical switch for outputting the input light to a desirable port, in accordance with the layout of the core.

The characteristics representing the optical features of the optical waveguide circuit are insertion loss (or propagation loss) and PDL (Polarization Dependent Loss). Usually, it is preferable that both of them are made as small as possible. Here, the PDL is a phenomenon in which the insertion loss of the optical waveguide is different in accordance with the polarization state of an input light, and this is represented by the separation amount between the insertion loss of a TE mode and the insertion loss of a TM mode. The separation is greatly caused by the double refraction of the optical waveguide. The double refraction implies that the optical waveguide has a different refraction index depending on a propagation direction of the light. The main factor of the generation of the double refraction is an internal stress of the optical waveguide (in other words, a stress acting to remain in equilibrium with a stress applied from outside).

As mentioned above, the optical waveguide is manufactured by laminating silicon oxide films on the substrate. At this time, usually, the process requires a heating process at a very high temperature such as about 1000° C. For this reason, when the substrate is made of silicon, a wafer is warped by the difference in thermal expansion coefficient between the deposited silicon oxide film and the substrate, and the manufactured optical waveguide receives a great stress from the substrate. This stress generates the PDL. For this reason, a technique is used in which various methods are considered and applied, to reduce the stress or provide the balance between the stresses so that the directionality does not appear.

As one approach among the methods, a structure is proposed in which the optical waveguide is separated from the silicon substrate. In this technique, the optical waveguide is partially floated from the silicon substrate in the shape of a bridge and the stress from the substrate is released to reduce the PDL. From now, such a structure is referred to as a bridge structure.

Hereinafter, a thermal optical phase shifter as an example of this bridge structure will be described, in which an effect other than the PDL reduction can be obtained from this structure.

In the optical waveguide structure, a method is often used in which a TO (Thermo-Optic) effect is used to add functions. This actively utilizes the physical phenomenon that a refraction index of glass material of the optical waveguide structure is changed dependent on temperature. For example, a Mach-Zehnder interferometer composed of a directional coupler in the optical waveguide circuit has a structure to branch an input light into two lights and re-combine them after the propagation of a distance equal to each other. Here, a metal heater is placed on the upper portion of one branched optical waveguide, and electric power is supplied to the heater. Consequently, the phase of the light to be guided can be changed by the generated heat. In such a configuration, when the branched optical waveguides are coupled to each other, the interference state is changed in accordance with a phase difference between the lights to be guided through the branched optical waveguides, so that an output light intensity can be changed. For example, when the phase difference is assumed to be a half of the wavelength of the light, the branched lights cancel off each other when they are coupled to each other. Thus, the output becomes approximately zero. Also, when the phase difference is assumed to be zero or equal to integer times of the wavelength, the light intensity can be extracted in its original state. Here, a portion of the circuit or structure for changing the phase is referred to as the thermal optical phase shifter.

These phenomena allow the Mach-Zehnder interferometer to function as an optical switch. Also, since the phase difference can be optionally given, it can be used as an optical attenuator through a continuous phase change.

In order to operate an optical device, the electric power is supplied to the heater, to control the refraction index. Thus, the consumed power necessary for the operation is desired to be small. Usually, the electric power required to shift the phase of the light having the wavelength of 1550 nm, which is often used in the optical communication, is about 400 mW without any change of the structure. If the waveguides for 40 channels are required, the electric power of about 16 W is required. Since this power is very large, it needs to reduce the electric power by modifying the optical waveguide structure.

As the typical approach for achieving the smaller consumed power of the thermal optical phase shifter in the planner light-wave circuit, the optical waveguide having the following structure is typically employed. That is, grooves are formed to put a portion of the optical waveguide functioning as the phase shifter between them. The groove is filled with air or is vacuumed. However, since a heat conductivity of gas is very low as compared with the silicon oxide film for the clad, the heat generated by the heater can be prevented from being diffused into the clad. Thus, the consumed power can be made very small. The above structure is referred to as a ridge structure, and the optical waveguide portion having such a structure is merely referred to as a ridge.

Usually, the thermal optical phase shifter having the above ridge structure is manufactured by the following way. After the formation of the optical waveguide, a metal film for the heater is formed on an upper clad film by a sputtering apparatus or an evaporating apparatus. Subsequently, the heater is formed in the desirable layout through a photolithography using a photo mask by a milling apparatus. Subsequently, similarly to a step of forming the core, the dry etching apparatus is used to form the grooves in the desirable positions. At this time, the heater is required to be sufficiently protected with a resist so that the heater is not damaged in the dry etching.

The following method is typically used in the ridge structure in order to improve a thermal efficiency.

(1) The lower clad layer of the optical waveguide is made thick. Consequently, a thermal resistance between the core and the silicon substrate is increased, to prevent the heat from diffusing into the silicon substrate.

(2) The width of the ridge is made narrow. In case of the ridge structure, the heat is mainly diffused from the ridge into the silicon substrate. Thus, as the width of the ridge is made narrower, the contact area between the ridge and the silicon substrate is made smaller, to suppress the thermal diffusion.

However, those methods have the respective limits because of the following reasons.

(1) As the lower clad layer is made thicker, the stress applied from the substrate to the silicon oxide film becomes stronger. Thus, the substrate is easy to be cracked. Also, when the double refraction is increased with the strong stress, the PDL of the optical waveguide is increased. Moreover, as the film becomes thicker, the manufacturing step time is longer.

(2) If the ridge width is made excessively thin, the guided light feels the roughness of a ridge side wall, and a dispersion loss is increased.

Even if the above measures are taken as much as possible, the effect of the smaller consumed power attained by the ridge structure usually is to reduce to an approximate half of the above consumed power less than the usual case. Thus, the value of 8 W for 40 channels cannot be said to be sufficiently small.

In this way, an approach proposed as the method of further reducing the consumed power in addition to the ridge structure is to employ a bridge structure. The bridge structure floats the optical waveguide in the shape of the bridge to separate the optical waveguide from the silicon substrate. In case of the thermal phase shifter having the ridge structure, the bridge structure is attained by separating the ridge from the silicon substrate. Similarly to the ridge structure to suppress the thermal diffusion to the clad, the bridge structure suppresses the thermal diffusion to the silicon substrate. Thus, the effect of the further great reduction in the consumed power is obtained. Originally, as mentioned above, the bridge structure has the feature of the reduction in the PDL, because the stress from the substrate that is caused due to a line expansion coefficient difference between the clad layer film and the substrate is released. Therefore, the employment of the bridge structure in the thermal optical phase shifter provides the two great effects of the smaller consumed power and the smaller PDL. Hereinafter, such a structure is referred to as the bridge structure, although being already described above. Also, the portion of waveguide floated in the shape of the bridge is referred to as a bridge.

The bridge structure can be attained by the technique referred to as a sacrifice layer etching that is well known as a MEMS (Micro Electro Mechanical Systems) technique. This technique is the method of depositing a sacrifice layer on a substrate in advance and finally etching only the sacrifice layer in an isotropic manner, as disclosed in Japanese Patent Application Publication (JP-P2004-37524A). This method is attained by using the silicon substrate and the sacrifice layer of PSG (PhosphoSilicate Glass, and performing the etching with hydrogen fluoride solution. Since the silicon oxide film has a high etching rate to the hydrogen fluoride solution when it is doped with phosphorous, it is possible to selectively etch only the PSG.

Although this method has a merit that a special apparatus is unnecessary, a seed film for the sacrifice layer must be formed between the lower clad layer ad the silicon substrate. One problem of this method is in that in addition to the increase in the film formation step, the silicon oxide film deposited on the sacrifice layer must be adjusted to function as the waveguide in the refraction index and the softening temperature while a high etching selection is held to the sacrifice layer. This implies that the design free degree of the entire manufacturing process is lost. Also, the silicon oxide film is etched more or less with hydrogen fluoride in addition to the sacrifice layer film. Thus, the design and technique for manufacturing without any damage as the optical waveguide are required.

From the above, there is a method of etching the silicon substrate as a substitution approach. In this case, since the sacrifice layer is unnecessary, the bridge structure can be attained without any influence on the conventionally established process for manufacturing the optical waveguide. The method is disclosed in "Bridge-Suspended Silica-Waveguide Thermo-Optic Phase Shifter and Its Application to Mach-Zehnder Type Optical Switch" by A. Sugita et al. (Trans. IEICE, Vol. E73 (1990) pp. 105-109).

Although disclosed in the above paper, the etching of the silicon substrate is usually attained such that after the formation of the ridge structure, the silicon substrate is immersed in etching solution or exposed to etching gas. Although it is described in the above paper that the silicon substrate is etched by the dry etching, the isotropic etching of the silicon substrate can be attained by using the gas such as xenon fluoride.

In conjunction with the above description, an optical circuit is disclosed in Japanese Patent Application Publication (JP-P2004-133130A). The optical circuit has a silicon substrate, an optical waveguide layer and a temperature controller. Here, the optical waveguide layer has a core and a clad, which are formed on the silicon substrate. The temperature controller is formed on the optical waveguide layer and controls the temperature of a part of the core locally and variably. The optical waveguide layer is removed in an interval from the core from the optical waveguide layer surface to the silicon substrate surface along the longitudinal direction of the core in both sides of the formation portion of the temperature controller. A rectangular concave section is formed in the silicon substrate surface portion in the entire region opposite to the lower portion of the removal portion of the optical waveguide layer. The surface of the silicon substrate has a (100) plane. The sidewall of the concave section formed along the longitudinal direction of the core has the (100) plane that is substantially perpendicular to the silicon substrate surface. The bottom plane of the concave section has the (100) plane that is substantially parallel to the silicon substrate surface.

Here, in the etching the silicon substrate as well as the sacrifice layer, there are two issues when the isotropic etching is carried out to manufacture the bridge structure.

At first, the above paper indicates that the silicon substrate immediately under the optical waveguide is removed by the isotropic dry etching. FIGS. 10A to 10C are diagrams showing states that the silicon substrate is partially removed through an isotropic dry etching. In case of the isotropic etching, the etching advances independently of the crystal plane orientation of the silicon substrate. Thus, the silicon substrate immediately under the optical waveguide is in one of the state that as shown in FIG. 10C, the silicon substrate is partially removed and there is no portion where the optical waveguide is perfectly separated from the silicon substrate; and the state that as shown in FIG. 10A, the whole silicon substrate is removed, and the optical waveguide is perfectly separated from the silicon substrate.

In the former case, the optical waveguide and the silicon substrate are not separated. Thus, the thermal diffusion is generated through the silicon substrate whose thermal conductivity is high. As a result, an object of reducing the consumed power cannot be achieved. Also, since the stress from the silicon substrate is not perfectly released, another object of reducing the PDL cannot also be achieved.

On the other hand, in the latter case, when the optical waveguide is perfectly separated from the silicon substrate, the thermal diffusion to the silicon substrate is greatly suppressed. However, since the optical waveguide is not supported by any supporting member, this structure is mechanically weak. When the region of the silicon substrate to be etched is narrow, the mechanical strength can be reinforced by forming a plurality of beams perpendicularly to the optical waveguide, as shown in FIGS. 10A to 10C. However, when the etching region is wide, there is not the member for supporting the optical waveguide from below. Thus, the optical waveguide is easily broken by an external force. Moreover, when there are the beams, the thermal diffusion is performed through the beam, and the effect of the reduction in the consumed power cannot be attained. In addition, when there is an interference structure represented by the Mach-Zehnder type, it is necessary to design the optical waveguide so as to consider the thermal diffusion in such a way that the heat added to the thermal optical phase shifter does not thermally interfere with the other optical waveguide.

From the above reasons, when the isotropic etching is performed to form the bridge structure, there is an approach to provide not the beam but a supporting column. For example, as shown in FIGS. 11A to 11C, the width of the ridge is made wide or an island is formed in the position of the supporting column to be provided in the optical waveguide. FIGS. 11A to 11C are shown in Japanese Patent Application Publication (JP-P2004-37524A). Here, a portion 12a of the silicon substrate 11 remaining immediately under the portion 24c wide in the ridge width, or an island portion 24c functions as the supporting column. For this purpose, a portion of the silicon substrate immediately under an optical waveguide 24 must be perfectly etched to separate the optical waveguide 24 from the silicon substrate 1. Moreover, the portion 12a of the silicon substrate 11 immediately under the wide portion or island portion 24c must not be entirely etched, and the etching must be stopped in the state that the optical waveguide 24 and the silicon substrate 11 are not separated.

However, in this case, there is the following issue. Clad layers 13 and 15 are left in their original states in the wide portion or island portion 24c without being etched. Thus, the thermal diffusion to the left clad layers 13 and 15 is generated to lower the thermal efficiency. Also, the design must be carried out in consideration of the influence of the thermal interference, and the degrees of freedom in the layout of the optical waveguide 24 are lost. For example, in order to leave a supporting column 12a of silicon having the same width as the ridge, the ridge width of the portion serving as the supporting column 12a must be doubled. Therefore, the design must be performed in consideration of the above matter in addition to structural and thermal interference.

The second issue in forming the bridge structure by using the isotropic etching will be described below. For example, in the above paper, the etching of the silicon substrate portion immediately under the optical waveguide advances at a same rate from both sides of the ridge. When the silicon substrate continues to be etched, the optical waveguide is separated from the silicon substrate, as shown in FIG. 10A. However, it should be noted that the optical waveguide is separated simultaneously and instantly in the entire portion. Usually, a high temperature treatment between about 800 and 1300° C. is performed on the films of the optical waveguide. Thus, the wafer is largely warped due to the thermal stress based on the difference in thermal expansion coefficient between the silicon oxide film of the waveguide and the silicon substrate. In short, the silicon oxide film receives the strong stress from the silicon substrate. Therefore, when the stress from the silicon substrate is instantly released, there is a case that the bridge is broken.

Actually, this issue is not limited to the isotropic etching. For example, in Japanese Patent Application Publications (JP-P2001-521180A and JP-P2004-133130A), a method is disclosed of removing a portion of a silicon substrate immediately under a straight optical waveguide by using an anisotropic etching. Since the anisotropic etching of the silicon substrate by using an etching solution does not require a special apparatus, the bridge structure can be easily formed. Also, a wet anisotropic etching solution is represented by potassium hydroxide (KOH), 4-methyl ammonium hydroxide (TMAH), ethylene diamine pyrocatechol (EDP) and the like. However, in particular, the KOH solution etches silicon to silicon oxide at the selection ratio of about several hundred times. Thus, the KOH solution has a feature that damage to the silicon oxide film of the optical waveguide can be largely reduced. However, the etching of the silicon substrate advances at the same rate from both sides of the optical waveguide even in any portion of the optical waveguide, in case of Japanese Patent Application Publication (JP-P2004-133130A). Thus, the separation of the optical waveguide from the silicon substrate is regarded as an instant phenomenon, which does not lead to the solution of the issue.

Naturally, it should be noted that the bridge structure in which the above-mentioned issues are settled cannot be applied only to the optical waveguide circuit, but also various fields other than the bridge structure through the etching the sacrifice layer, such as a cantilever in the MEMS field.

DISCLOSURE OF INVENTION

It is therefore a subject matter of the present invention to provide a bridge structure on a silicon substrate in which the bride structure is easy in manufacturing and excellent in mechanical strength, and a method of manufacturing the same. An optical waveguide circuit can use the bridge structure, and a thermal optical phase shifter can use the optical waveguide circuit. Methods of manufacturing the optical waveguide circuit and the thermal optical phase shifter can be provided.

In a first exemplary embodiment of the present invention, a silicon structure includes a silicon substrate; an on-substrate structure formed on the silicon substrate and including a silicon compound film; and supporting columns formed depending on crystal orientation of the silicon substrate to extend from the silicon substrate and configured to support the on-substrate structure. The supporting columns are provided straightly below the on-substrate structure on the silicon substrate.

An optical waveguide uses the above on-substrate structure. Also, a thermal optical phase shifter uses the on-substrate structure, and the on-substrate structure further includes a heater formed on the on-substrate structure.

In a second exemplary embodiment of the present invention, a method of manufacturing a silicon structure, includes providing an on-substrate structure on a silicon substrate along a predetermined line; and etching said silicon substrate such that a part of said silicon substrate is removed depending on crystal planes of said silicon substrate.

BRIEF DESCRIPTION OF THE DRAWINGS

The above and other objects, advantages and features of the present invention will be more apparent from the following description of certain exemplary embodiments taken in conjunction with the accompanying drawings, in which:

FIGS. 4C-1-1 to 4C-5-3 are cross sectional views of the on-substrate structure in the present invention;

Exemplary Embodiments

Hereinafter, a silicon structure according to exemplary embodiments of the present invention will be described in detail with reference to the attached drawings. Here, an optical waveguide circuit will be described as one application of the silicon structure. In the optical waveguide circuit, a bridge structure is employed to have a core and a clad. The core and clad in the optical waveguide are formed of two kinds of silicon oxide films whose refraction indexes are different, and the optical waveguide is not substantially removed even if anisotropic etching is performed.

Figure 1:
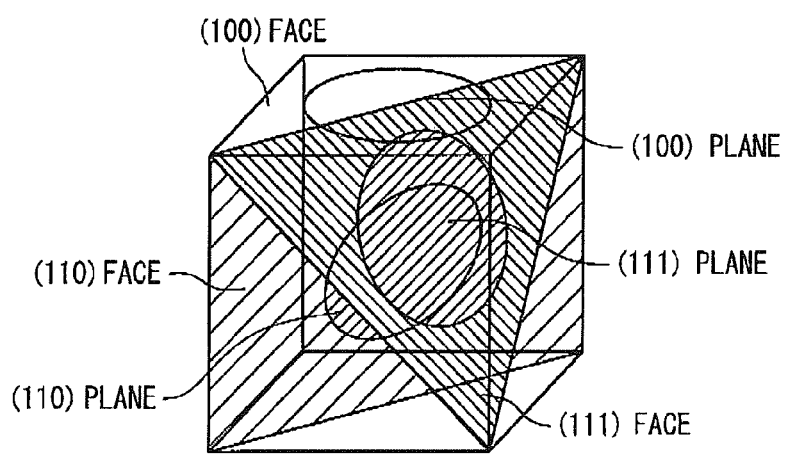
FIG. 1 is a conceptual view showing plane orientations of a substrate.

FIG. 1 is a conceptual diagram showing crystal planes. Before the description of the present invention is started, the crystal planes are defined.

The single crystal of silicon has a diamond structure. A unit cell in the diamond structure is a cube. Thus, the silicon crystal has a (100) plane, a (110) plane, and a (111) plane, as well known. The present invention utilizes a fact that etching rates of the (100) plane, the (110) plane and the (111) plane are different.

Figure 2A:
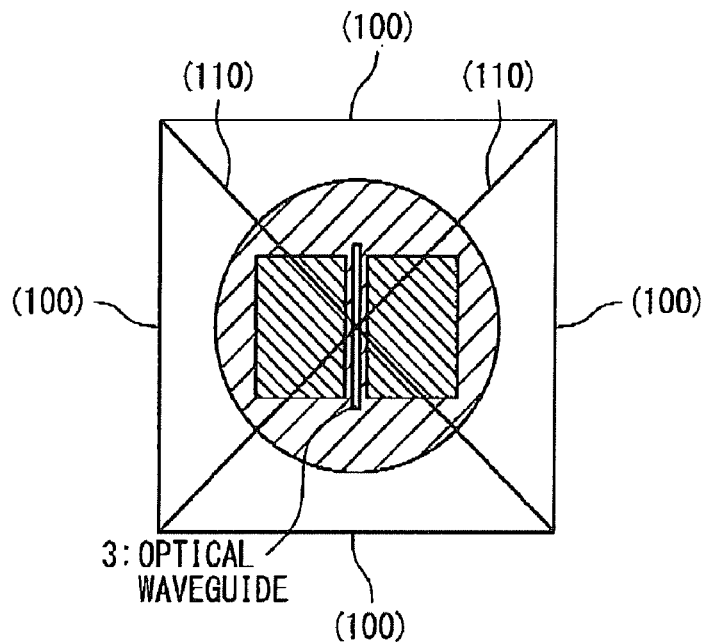
FIGS. 2A and 2B show that an optical waveguide is formed on a (001) plane silicon substrate in parallel to a (100) plane in a related art.
Figure 2B:
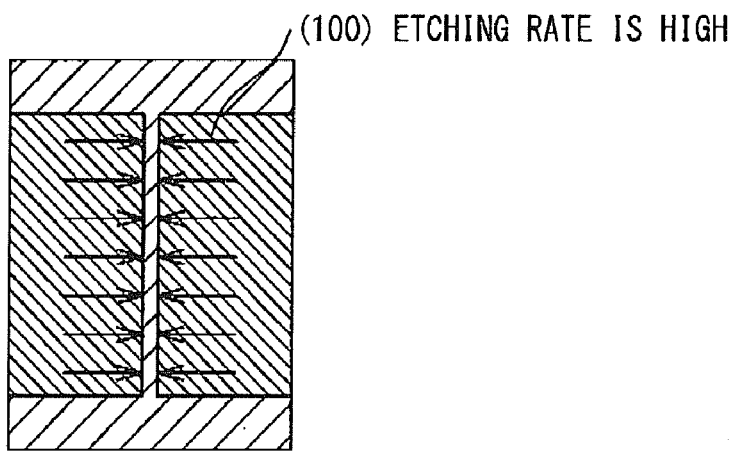

FIGS. 2A and 2B show an example in which concave sections are formed in a (001) plane silicon substrate in parallel to the (100) plane. The planes corresponding to the four sides when the cube as the unit cell of the diamond structure is viewed from an upper portion are the (100) planes and (010) planes, and planes corresponding to the two diagonals are the (110) planes. Here, in case of the anisotropic etching, the (100) plane, the (010) plane or the (001) plane is the largest etching rate. In other words, the etching performed in the direction perpendicular to the (100) plane is largest. The etching rate performed in the direction that includes a directional component perpendicular to the (100) plane and a different directional component is continuously changed depending on a rate of the different directional component.

Figure 3A:
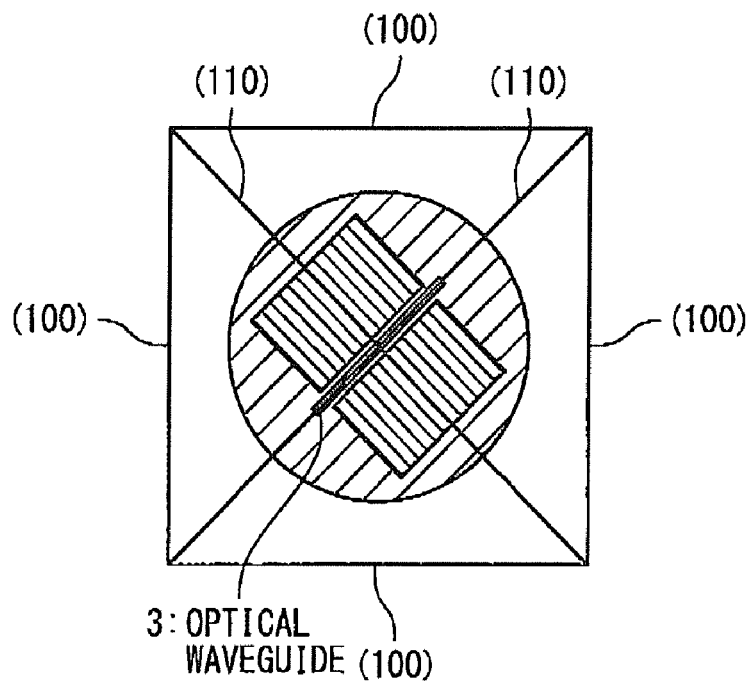
FIGS. 3A and 3B show that an optical waveguide is formed on a (001) plane silicon substrate in parallel to a (110) plane in a related art.
Figure 3B:
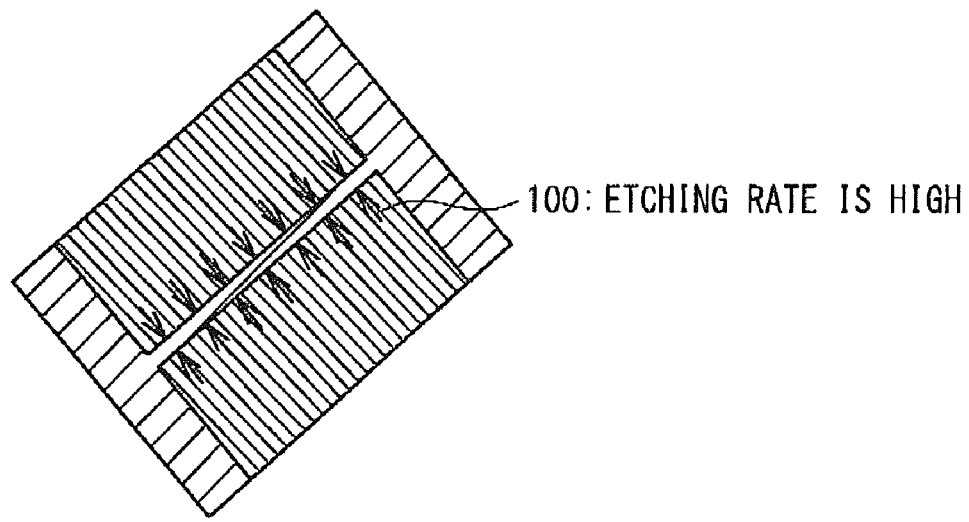

FIGS. 3A and 3B show an example in which grooves parallel to the (110) plane are formed in the (100) substrate. Similarly to FIGS. 2A and 2B, the etching performed on the plane parallel to the (110) plane is slow in the etching rate. Specifically, there is a case that it is slower about 100 times than the etching rate in the plane parallel to the (100) plane. This is because the etching into that direction exposes the (111) plane, which is the most difficult to etch.

FIGS. 4A, 4B, and 4C-1-1 to 4C-5-3 show a case that the curved optical waveguide is formed on the (001) plane silicon substrate in the present invention. Here, an optical waveguide 3 is formed along a predetermined line (hereafter, to be reference to as a fundamental curve) 7. When the anisotropic etching is performed on the silicon layer of the optical waveguide that is designed in the shape of the curve 7 on the silicon substrate, the etching is performed at the fastest etching rate at the point at which an angle $\theta_{100}$ between a tangential line of the waveguide in a plane that is perpendicular to a waveguide sidewall and parallel to the surface of the silicon substrate and the (100) plane is zero (namely, both have a parallel relation). Also, the etching rate becomes the slowest etching rate at the point at which an angle $\theta_{110}$ between the tangential line of the waveguide and the (110) plane is zero (at this time, $\theta_{100}$ is 45°, however, 135° in case of a supplementary angle). At an angle between them, the etching rate is continuously changed.

Figure 4A:
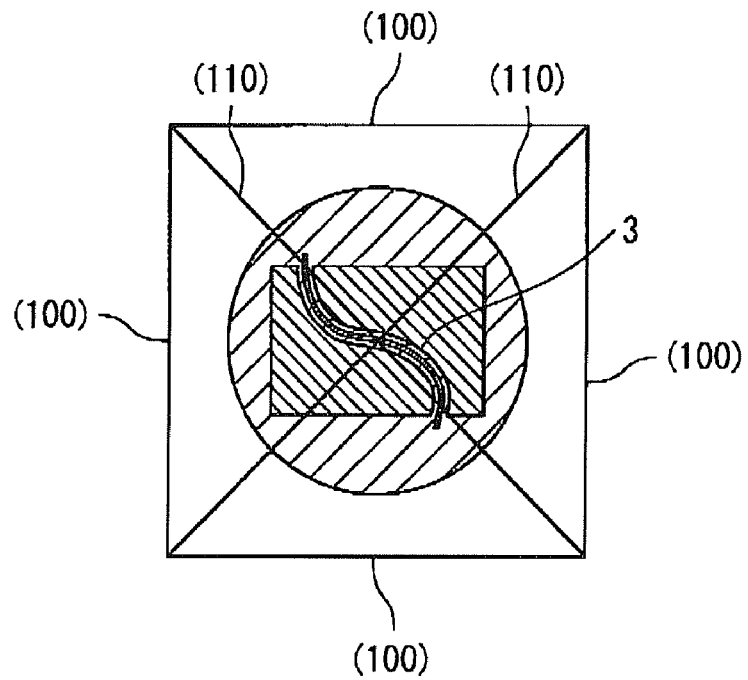
FIGS. 4A and 4B show that a curved optical waveguide as an on-substrate structure is formed on the (001) plane silicon substrate in the present invention.
Figure 4B:
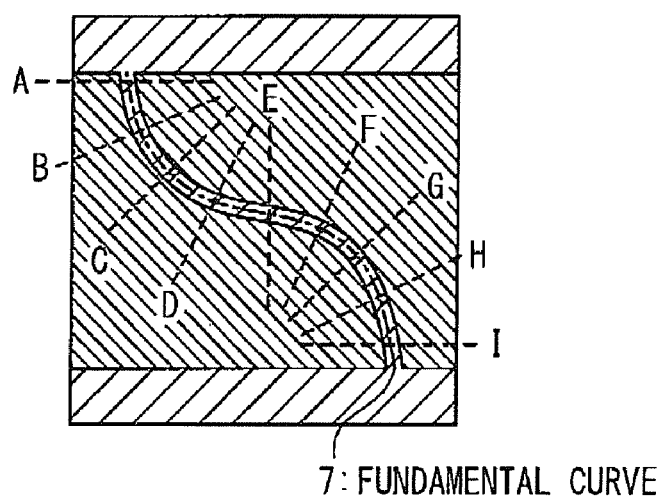
Figures 1, 2, 3, 4C:
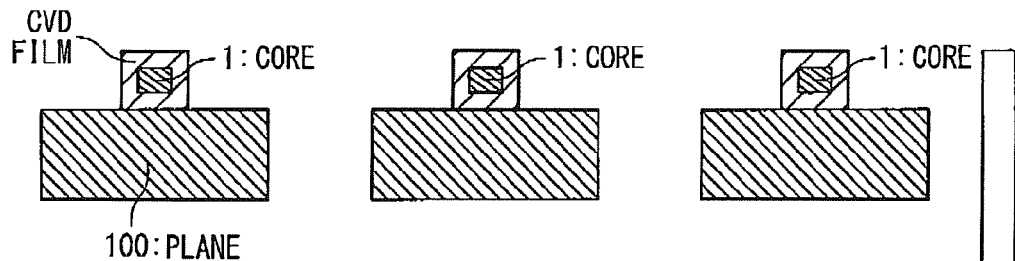
Figures 1, 2, 3, 4C:
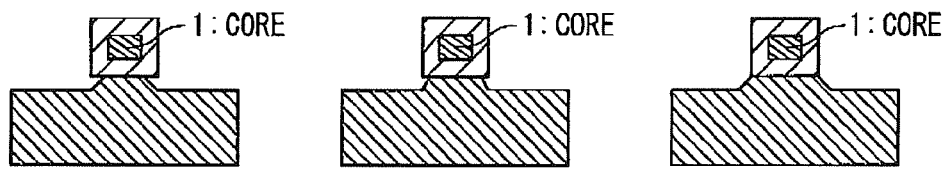
Figures 1, 2, 3, 4C:
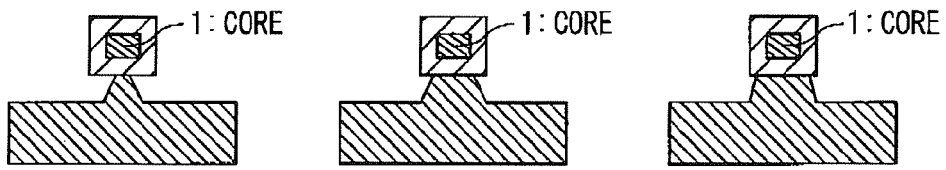
Figures 1, 2, 3, 4, 4C:
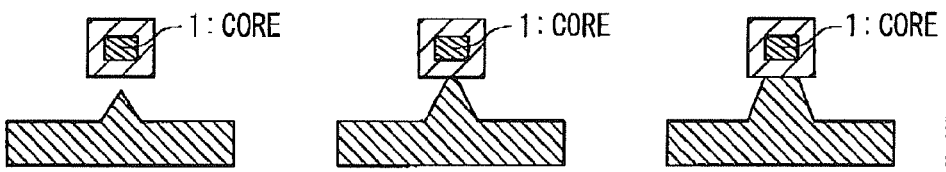
Figures 1, 2, 3, 4, 4C, 5:
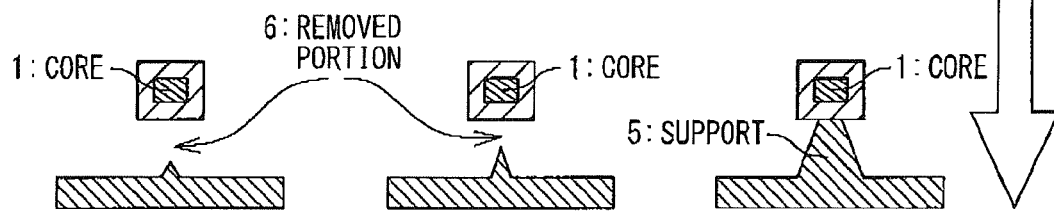

In an example shown in FIGS. 4A and 4B, the silicon substrate is immersed in, for example, KOH solution for etching. At this time, the etching rate of silicon is the fastest at points A, E and I and becomes continuously slower as the points become closer to points C and G. Thus, the bridge structure is gradually formed while etching the silicon substrate immediately under the optical waveguide, as shown in FIG. 4C-1-1 to 4C-5-3. In short, by the anisotropic etching, the silicon substrates at the points A, E and I are firstly removed, as shown in FIGS. 4C-1-1 to 4C-4-1, and the removed region on the silicon substrate becomes gradually wider toward the points C and G, as shown in FIGS. 4C-1-2 to 4C-5-2. Here, the fact that the silicon substrate located immediately under the optical waveguide is etched at the points A, E and I although the optical waveguide is not substantially etched, as shown in FIG. 4C-1-1, is referred to as "undercut".

The etching rate in the anisotropic etching is increased exponentially to the tangential angle of the waveguide. Thus, a period until the completion of the anisotropic etching, namely, a period while the silicon substrate is immersed in the KOH is adjusted so that the silicon substrate at the points C and G can be left as a result of a high etching selection ratio, as shown in FIGS. 4C-1-3 to 4C-5-3. Thus, since the points C and G are a portion of the silicon substrate where the etching rate is slower so that the silicon substrate portion is remained without being etched, the remaining portion can support the silicon substrate as supporting columns for supporting the optical waveguide, as shown in FIG. 4C-5-3. In short, the bridge structure of the optical waveguide 3 can be attained without being broken by instantly releasing the stress as to be supported in the shape of the bridge on the silicon substrate 2. Moreover, in this way, since being configured such that the external stress is mainly applied to in a curvature radius direction of the fundamental curve 7, the curved bridge structure has the stress resistance higher than that of the straight bridge structure. Also, by utilizing a fact that the etching rate is largely different depending on the crystal orientation, it is possible to easily manufacture the supporting columns 5 of silicon.

Specifically, it is preferred that the optical waveguide 3 is designed to have the shape of the fundamental curve 7. At this time, the curvature radius direction of the fundamental curve 7 is preferred to be continuously varied along the optical waveguide 3. This is because when the curvature radius direction of the fundamental curve 7 is continuously varied, the etching rate is also continuously varied so that the anisotropic etching can be attained. As a specific example, when the curvature radius direction of a removal portion of an on-substrate structure is equal to a predetermined direction, the etching rate is large. Oppositely, when the curvature radius direction of the supporting column of the on-substrate structure is equal to another predetermined direction, the etching rate is small.

As a result, a removal part 6 of the portion of on the silicon substrate 2 immediately under the optical waveguide 3 is etched in a short time when the etching rate to the removal part is large. In short, the removal part 6 is gradually increased, as the etching is continuously performed. That is, this implies that the removed part 6 is gradually increased along the optical waveguide 3. Since the separation of the optical waveguide 3 from the silicon substrate 2 is not quickly advanced but is gradually advanced, a stress applied to the optical waveguide 3 at once is small so as to reduce a risk of crack generation.

Next, in order to design the bridge structure of the optical waveguide 3, it is necessary to satisfy the following conditions. That is, the bridge structure is provided with the supporting columns 5 for supporting the optical waveguide 3, and each of the removal parts 6 is present between adjacent two of the supporting columns 5 under the optical waveguide 3. The removal parts 6 are first removed to leave the supporting columns 5, and while the supporting columns 5 are left, the anisotropic etching must be completed. The removal parts 6 are arranged so that orientation of the removal parts 6 are determined based on the large etching rate.

On the contrary, the supporting column 5 must not be removed even after the completion of the anisotropic etching. Thus, the side of the supporting column 5 must be the silicon crystal plane in which the etching rate is small, or the plane close to it. Specifically, the plane is the (110) plane or the (111) plane. Therefore, the supporting columns 5 are arranged so that orientation of the supporting columns 5 are determined based on the small etching rate.

Figure 5A:
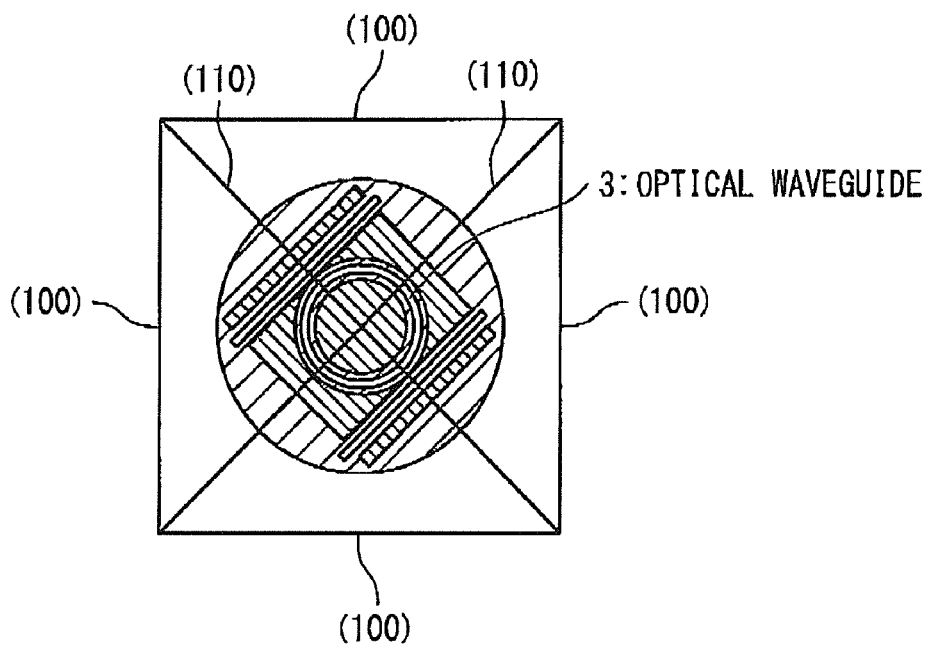
FIGS. 5A and 5B show that a ring waveguide is formed on the (001) plane silicon substrate in the present invention.
Figure 5B:
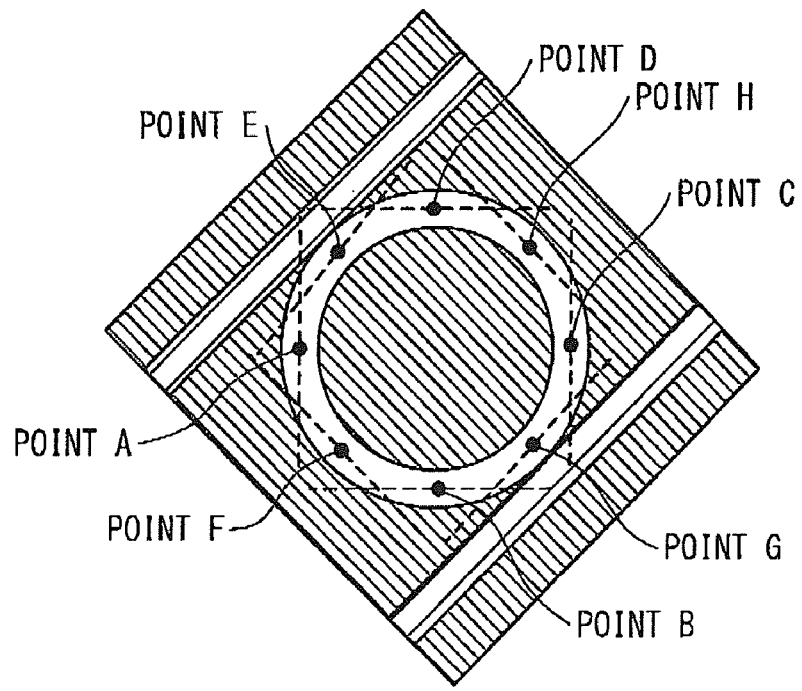

FIGS. 5A and 5B show an example of a case when a ring waveguide 3 is formed on the (100) plane of the silicon substrate 2 according to the present invention. The supporting columns 5 of the silicon substrate 2 remain in planes containing points E to H parallel to the (110) plane. The ring waveguide 3 is floated in the shape of the bridge in planes containing points A to D parallel to the (100) plane.

Figure 6A:
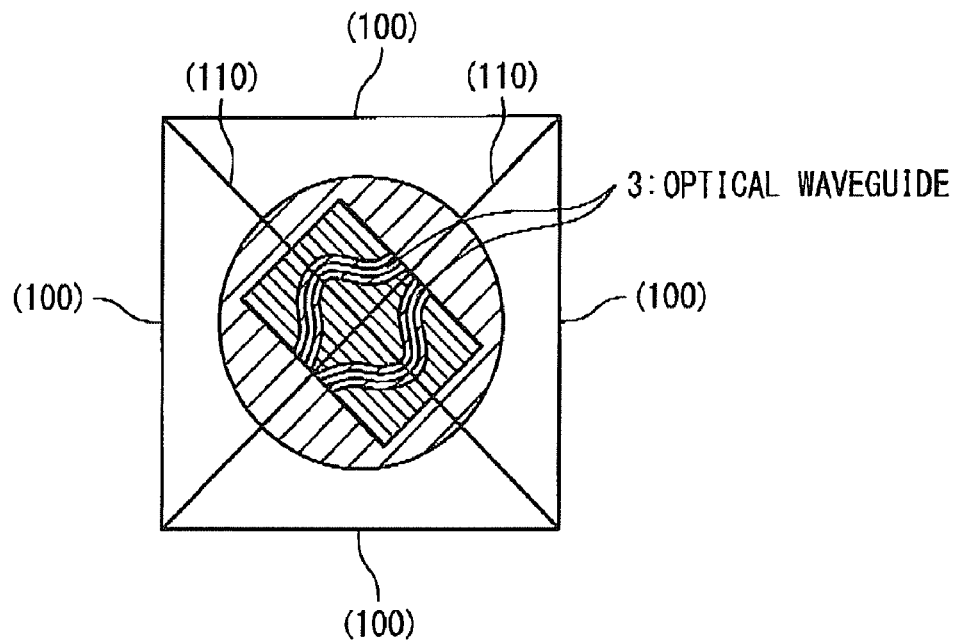
FIGS. 6A and 6B show that a target Mach-Zehnder waveguide is formed on the (001) plane silicon substrate in the present invention.
Figure 6B:
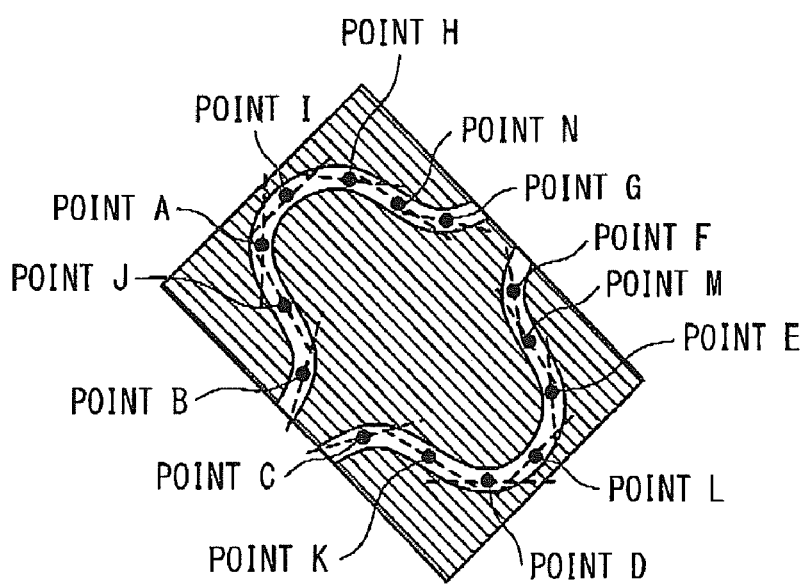

FIGS. 6A and 6B show an example of a case that the target Mach-Zehnder waveguide 3 is formed on the (100) plane of the silicon substrate according to the present invention. The supporting columns 5 of the silicon substrate 2 remain at points I to N parallel to the (110) plane. At points A to H parallel to the (100) plane, the ring waveguide 3 is floated in the shape of the bridge.

Figure 7A:
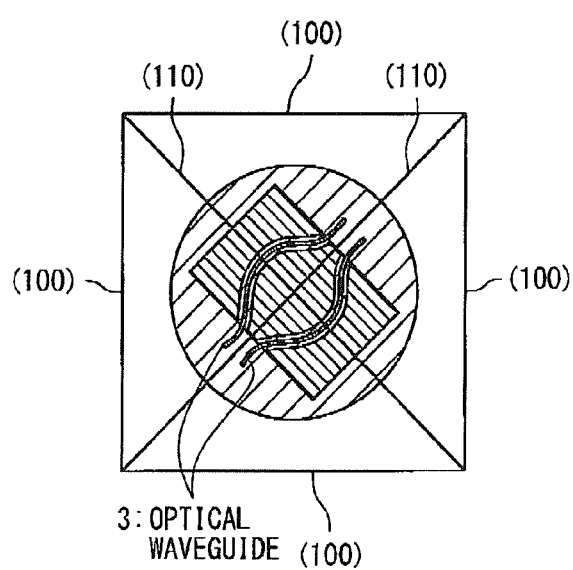
FIGS. 7A and 7B show that the target Mach-Zehnder waveguide is formed on the (100) plane silicon substrate in the present invention.
Figure 7B:
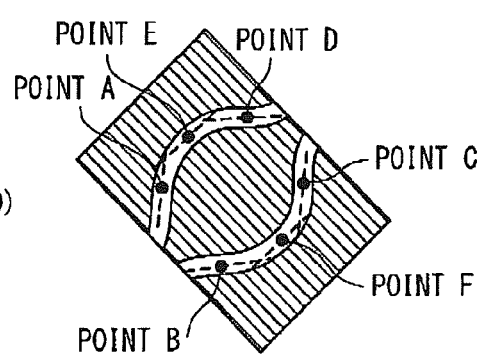

FIGS. 7A and 7B show an example of a case that the target Mach-Zehnder waveguide 3 is formed on the (100) plane of the silicon substrate. The supporting columns 5 on the silicon substrate 2 remain at points E and F parallel to the (110) plane. At points A to D parallel to the (100) plane, the ring waveguides 3 are floated in the shape of the bridge.

As can be understood from the comparison between FIGS. 6A and 6B and FIGS. 7A and 7B, the length of the waveguide 3 can be freely designed, even in the Mach-Zehnder waveguide 3 that has the similar supporting column arrangement structure, by using only the curved waveguide 3 of the present invention,.

Figure 8A:
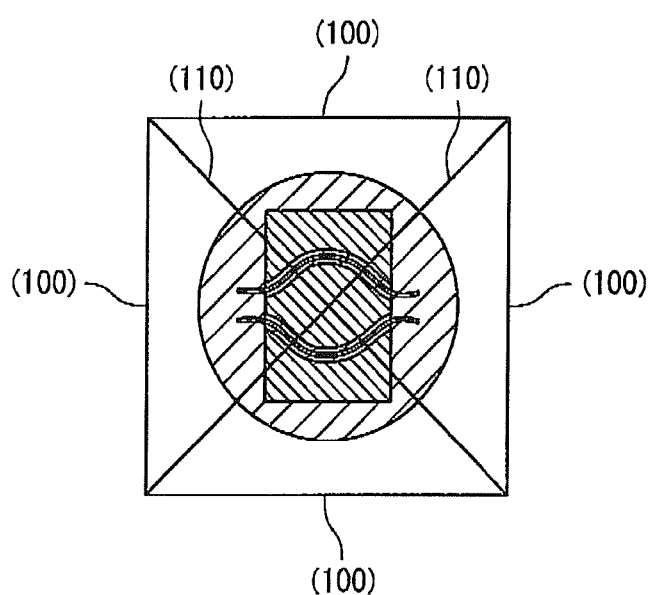
FIGS. 8A and 8B show that the target Mach-Zehnder waveguide is formed on the (001) plane silicon substrate in the present invention.
Figure 8B:
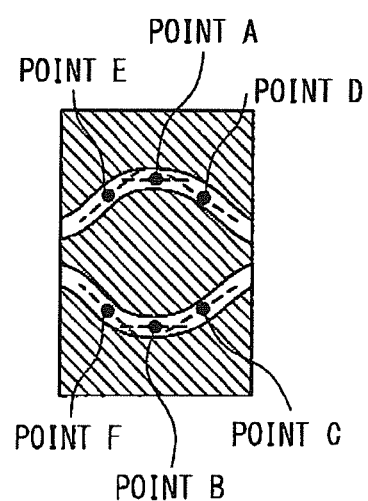

FIGS. 8A and 8B show an example of a case that the target Mach-Zehnder waveguide 3 is formed on the (100) plane of the silicon substrate 2. The supporting columns 5 of the silicon substrate 2 remain at planes containing points C to F parallel to the (110) plane. At planes containing the points A and B parallel to the (100) plane, the ring waveguide 3 is floated in the shape of the bridge.

As can be understood from the comparison between FIGS. 7A and 7B and FIGS. 8A and 8B, the different supporting column arrangement structure can be freely designed, even in the Mach-Zehnder waveguide 3 that has the waveguide 3 of the same length, by using only the curved waveguide 3 of the present invention.

Figure 9A:
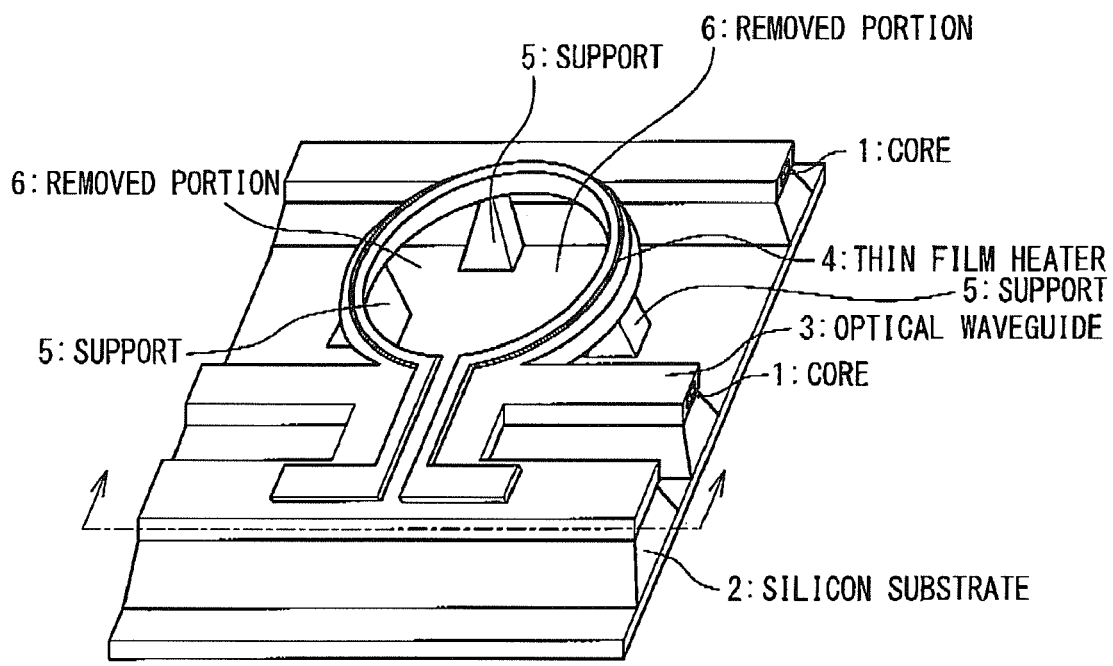
FIGS. 9A and 9B show that the present invention is applied to a ring waveguide.
Figure 9B:
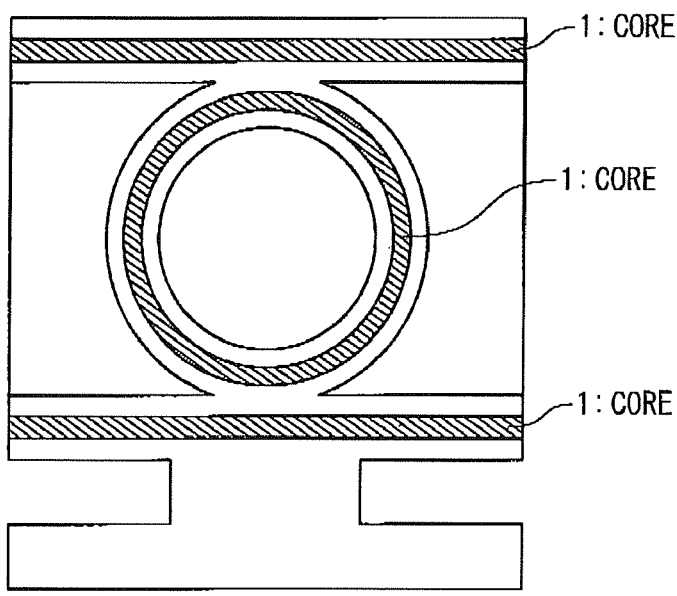
Figure 10A:
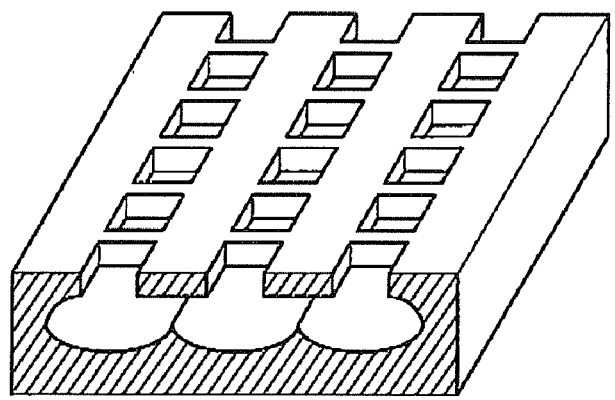
FIGS. 10A to 10C show that the silicon substrate is partially removed in an isotropic manner in a dry etching.
Figure 10B:
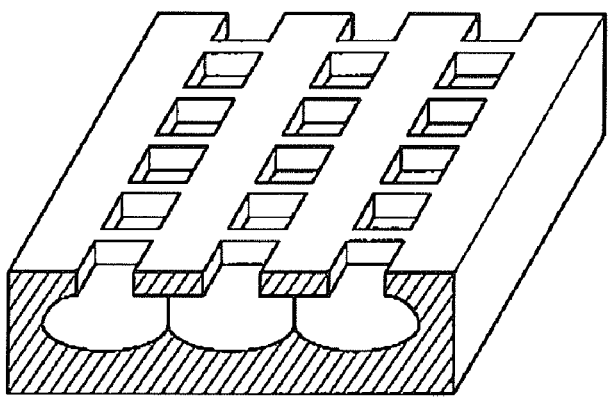
Figure 10C:
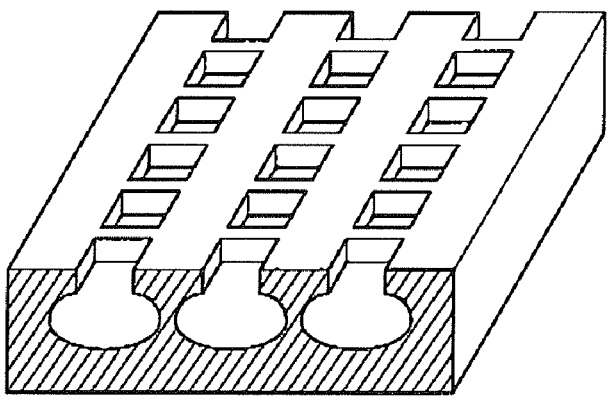
Figure 11A:
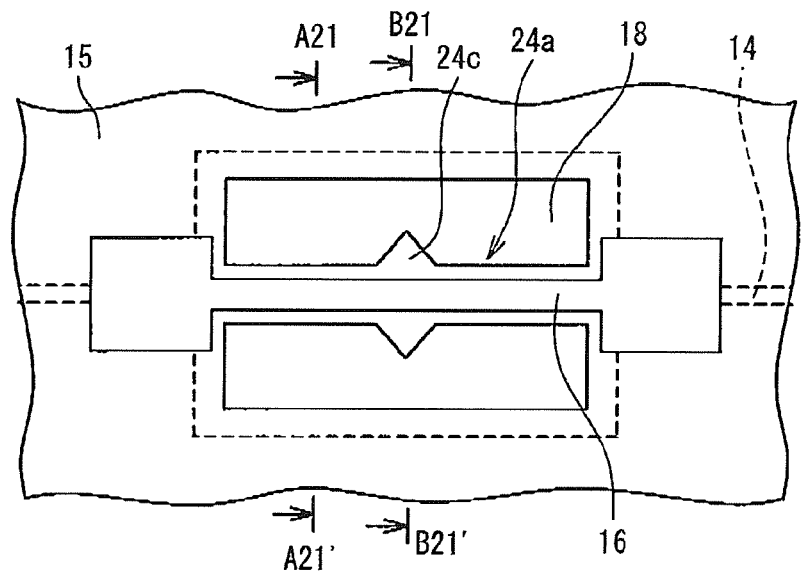
FIGS. 11A to 11C show a method of thickening the width of a ridge or providing an island at only the position at which a supporting column is desired to be provided for the optical waveguide.
Figure 11B:
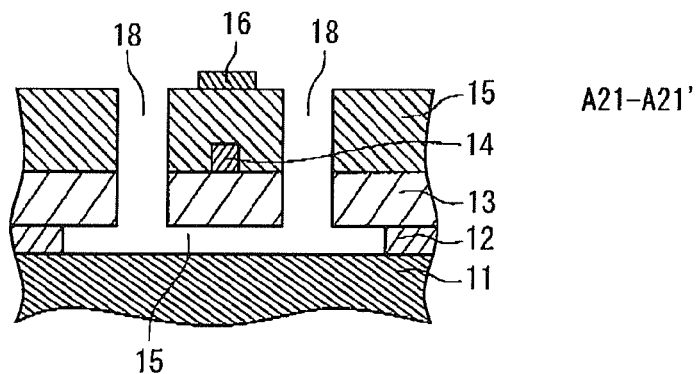
Figure 11C:
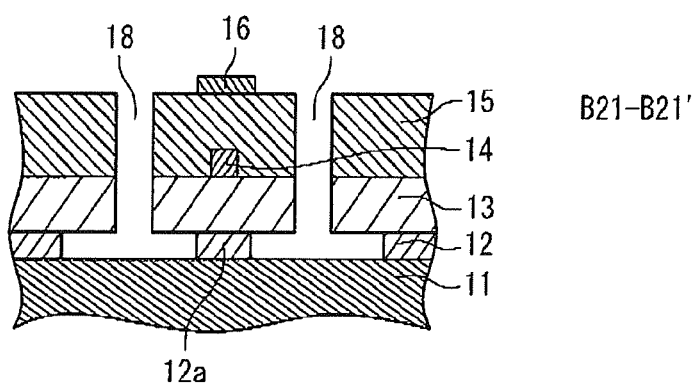

FIGS. 9A and 9B show an example of a case that the present invention is applied to the ring waveguide 3. Here, the ring waveguide 3 contains the silicon substrate 2, the optical waveguide 3 and a thin film heater 4. The optical waveguide 3 contains straight portions and a ring portion, and each of them contains a central core 1 and a clad around the core 1. The core 1 and the clad in the optical waveguide 3 are made of silicon oxide. Moreover, the core 1 is doped with phosphorous. Thus, a difference is set between the refraction indexes of both of them. Here, although a silicon oxide structure is exemplified as the on-substrate structure, a different silicon compound structure may be used. For example, silicon carbide, silicon nitride and the like have a sufficient durability against the anisotropic etching to the silicon substrate 2. Thus, they can be applied to the silicon structure of the present invention.

It should be noted that the core 1 and the clad in the optical waveguide 3 are formed in the following manner, before the anisotropic etching is performed on the silicon substrate 2. At first, a portion of the clad located below the core 1 is formed as a silicon oxide film on the silicon substrate 2 by CVD (Chemical Vapor Deposition). This portion of the clad is referred to as a lower layer clad. Subsequently, the core 1 is formed as the silicon oxide film on the lower layer clad, and a doping is performed to the silicon oxide film for the core 1. Finally, the remaining clad is formed on the lower layer clad and the core 1 so that the core 1 is surrounded by the clad. The remaining clad is referred to as the upper layer clad.

The silicon substrate 2 contains a portion of the optical waveguide 3 for supporting the entire straight portion of the optical waveguide 3, and a portion of the supporting columns 5 for similarly supporting a part of the ring portion from below. The thin film heater 4 is a metal film that is deposited on the optical waveguide 3 by a sputtering method. The thin film heater 4 contains a portion having substantially the same shape as the ring portion of the optical waveguide 3, and the two terminals to be connected to a power supply circuit (not shown).

The silicon substrate 2 supports the optical waveguide 3 from below. However, the whole straight line portion of the optical waveguide 3 is supported by the silicon substrate 2. However, with regard to the ring portion, only a part thereof is supported by the portion of the supporting columns 5 of the silicon substrate 2. In the optical waveguide 3, the ring portion is connected to the two straight portions that extend in the right and left sides. The thin film heater 4 is formed on the ring portion in the optical waveguide 3.

The electric power is supplied to the thin film heater 4 from the power supply circuit (not shown), and the ring portion of the optical waveguide 3 is heated by Joule heat. In the ring waveguide 3, its refraction index is thermo-optically changed, thereby setting its filter property to a desirable value. Here, most of the ring waveguide 3 is floated in the shape of the bridge from the silicon substrate 2. Thus, the electric power supplied to the thin film heater 4 can be largely saved.

In order to form such an optical ring waveguide 3, the crystal structure is arranged in the optical waveguides 3, as already shown in FIGS. 5A and 5B. That is, the supporting columns 5 on the silicon substrate 2 are left at the points E to H through the anisotropic etching, and the ring waveguide 3 is floated in the shape of the bridge at the points A to D.

In the above, a method of utilizing a high etching rate and using the (100) substrate has been described. That is, a case that the (100) plane is the surface of the silicon substrate 2 has been discussed. However, the present invention can be applied even in a (110) plane silicon substrate or even in a (111) plane silicon substrate. In case of the (110) plane silicon substrate, since the (111) plane is exposed, so that the surface becomes more parallel to the (111) plane, the etching becomes more difficult. Also, in case of the (111) plane silicon substrate, the surface is already the (111) plane in which the etching is difficult. Thus, it is necessary to expose the (100) plane and the (110) plane by firstly etching the (111) plane by using any method such as the dry etching or the like. Also, the etching rate difference between the (100) plane and the (110) plane is very smaller than the etching rate difference between the (100) plane or the (110) plane and the (111) plane. As a result, in case of using those etching rate differences, it is desired to sufficiently dilute and use the anisotropic etching solution such as KOH, and then to reduce the etching rate of the entire anisotropic etching so that a time difference between the etching removals can be sufficiently reserved.

While the present invention has been particularly shown and described with reference to the exemplary embodiments thereof, the present invention is not limited to these exemplary embodiments. The applicable field is not limited to the optical waveguide structure or the thermal optical phase shifter. In particular, this can be applied to the MEMS field. It will be understood by those of ordinary skill in the art that various changes in form and details may be made therein without departing from the spirit and scope of the present invention as defined by the claims.

What is claimed is:

1. A silicon structure comprising:
   a silicon substrate having a primary surface and at least one supporting column, a top of the supporting column being higher than all other surfaces of the silicon substrate, and all surfaces of the supporting column are at least substantially non-curved; and
   an on-substrate structure including a silicon compound film and formed on said silicon substrate, the on-substrate structure supported by the supporting column, wherein the supporting column has a base, the top, and one or more side surfaces, the base extending from the primary surface of the silicon substrate, the top making direct contact with the on-substrate structure, the base having a width greater than a width of the top, the side surfaces joining the top with the base, the side surfaces continually tapering from a greatest width at the base to a smallest width at the top such that the smallest width of the side surfaces at the top is smaller than all other widths of the side surfaces,
   and wherein said on-substrate structure comprises:
      a clad layer formed from a film; and
      a single doped core formed from a film, the core having a refractive index different from said clad layer.

2. The silicon structure according to claim 1, wherein said on-substrate structure comprises a portion formed along a line which belongs to a plane parallel to a surface of said silicon substrate.

3. The silicon structure according to claim 2, wherein at least one removal section is removed through anisotropic etching to result in the supporting column being formed, wherein an etching rate of the anisotropic etching depends on a direction of the anisotropic etching, and
   wherein in projection onto the silicon substrate surface, the etching rate is lower when the direction of the anisotropic etching is coincident with a direction of the radius of curvature corresponding to said supporting column not a direction of the radius of curvature corresponding to the removal section.

4. The silicon structure according to claim 2, wherein at least one removal section is removed through anisotropic etching to result in the supporting column being formed, and wherein the line contains a curve in which a direction of a radius of curvature changes continuously, and the etching rate of the anisotropic etching changes continuously, depending on the direction of advancement of the anisotropic etching.

5. The silicon structure according to claim 1, wherein a plane of said silicon substrate is (100)-plane.

6. The silicon structure according to claim 1, wherein a plane of said silicon substrate is (110)-plane.

7. The silicon structure according to claim 1, wherein a plane of said silicon substrate is (111)-plane.

8. The silicon structure according to claim 1, wherein the film is a silicon oxide film.

9. The silicon structure according to claim 1, wherein the film is a silicon carbide film.

10. The silicon structure according to claim 1, wherein the film is a silicon nitride film.

11. The silicon structure according to claim 1, wherein at least one removal section is removed through anisotropic etching to result in the supporting column being formed, and wherein the anisotropic etching is a wet etching using potassium hydroxide.

12. A thermo-optic phase shifter comprising: a silicon structure which comprises:
   a silicon substrate having a primary surface and at least one supporting column, a top of the supporting column being higher than all other surfaces of the silicon substrate, and all surfaces of the supporting column are at least substantially non-curved; and
   an on-substrate structure including a silicon compound film and formed on said silicon substrate, the on-substrate structure supported by the supporting column, wherein the supporting column has a base, the top, and one or more side surfaces, the base extending from the primary surface of the silicon substrate, the top making direct contact with the on-substrate structure, the base having a width greater than a width of the top, the side surfaces joining the top with the base, the side surfaces continually tapering from a greatest width at the base to a smallest width at the top such that the smallest width of the side surfaces at the top is smaller than all other widths of the side surfaces, wherein said on-substrate structure comprises:

a clad layer formed from a silicon oxide film; and a single doped core formed from a silicon oxide film, the core having a refractive index different from said clad layer, and wherein said thermo-optic phase shifter further comprises:

a thin-film heater made of metal on said on-substrate structure.

* * * * *